US010615809B2

(12) United States Patent
Gupta et al.

(10) Patent No.: US 10,615,809 B2
(45) Date of Patent: Apr. 7, 2020

(54) CALIBRATION OF A VOLTAGE CONTROLLED OSCILLATOR TO TRIM THE GAIN THEREOF, USING A PHASE LOCKED LOOP AND A FREQUENCY LOCKED LOOP

(71) Applicant: STMicroelectronics International N.V., Schiphol (NL)

(72) Inventors: Nitin Gupta, Kurukshetra (IN); Ankit Gupta, Delhi (IN); Anand Kumar, Noida (IN)

(73) Assignee: STMicroelectronics International N.V., Schipohol (NL)

( * ) Notice: Subject to any disclaimer, the term of this patent is extended or adjusted under 35 U.S.C. 154(b) by 127 days.

(21) Appl. No.: 15/718,715

(22) Filed: Sep. 28, 2017

(65) Prior Publication Data

US 2019/0097641 A1    Mar. 28, 2019

(51) Int. Cl.
| | | |
|---|---|---|
| H03L 7/099 | (2006.01) |
| H03L 1/00 | (2006.01) |
| H03L 7/18 | (2006.01) |
| H03L 7/22 | (2006.01) |
| H03L 7/087 | (2006.01) |
| H03L 7/093 | (2006.01) |
| H03L 7/089 | (2006.01) |

(52) U.S. Cl.
CPC ............... *H03L 7/099* (2013.01); *H03L 1/00* (2013.01); *H03L 7/087* (2013.01); *H03L 7/18* (2013.01); *H03L 7/22* (2013.01); *H03L 7/0891* (2013.01); *H03L 7/093* (2013.01); *H03L 2207/05* (2013.01)

(58) Field of Classification Search
None
See application file for complete search history.

(56) References Cited

U.S. PATENT DOCUMENTS

| | | | | |
|---|---|---|---|---|
| 7,279,987 B1 * | 10/2007 | Kaszynski | ............... | H03L 7/08 331/1 A |
| 7,312,663 B2 | 12/2007 | Abel | | |
| 7,546,097 B2 * | 6/2009 | Dunworth | ............. | H03L 7/0898 455/124 |
| 7,746,178 B1 * | 6/2010 | Humphreys | ............ | H03L 7/085 331/1 A |
| 7,932,784 B1 * | 4/2011 | Janesch | ................... | H03L 7/087 331/10 |
| 8,508,303 B2 * | 8/2013 | Maeda | .................... | H03L 7/093 331/1 A |
| 8,841,948 B1 * | 9/2014 | Chien | ..................... | H03L 7/081 327/149 |
| 8,902,009 B1 * | 12/2014 | De Bernardinis | ... | H03B 5/1228 331/117 FE |

(Continued)

*Primary Examiner* — Lincoln D Donovan
*Assistant Examiner* — Khareem E Almo
(74) *Attorney, Agent, or Firm* — Crowe & Dunlevy

(57) ABSTRACT

Disclosed herein is a method of calibrating a voltage controlled oscillator (VCO) for a phase locked loop. The method includes prior to activating the phase locked loop, and prior to activating a frequency locked loop, causing a bias signal generator circuit to generate a control signal with a fixed control voltage for the VCO. The method continued with activating the frequency locked loop, and adjusting the bias signal generator to calibrate a transconductance of the bias signal generator while the frequency locked loop is activated. The frequency locked loop is then deactivated, and the phase locked loop is activated.

21 Claims, 2 Drawing Sheets

(56) References Cited

U.S. PATENT DOCUMENTS

| | | | |
|---|---|---|---|
| 9,325,324 B1 | 4/2016 | Gupta et al. | |
| 9,401,724 B1* | 7/2016 | Gao | H03B 1/00 |
| 9,531,267 B2* | 12/2016 | Fan | H02M 3/1588 |
| 2008/0238489 A1* | 10/2008 | Sanduleanu | H03L 7/087 |
| | | | 327/42 |
| 2009/0128206 A1* | 5/2009 | Boerstler | H03K 3/017 |
| | | | 327/175 |
| 2010/0214029 A1* | 8/2010 | McDonald | H03L 7/23 |
| | | | 331/18 |
| 2012/0212300 A1* | 8/2012 | Tang | H03B 5/1228 |
| | | | 331/117 FE |
| 2014/0197894 A1* | 7/2014 | Tajalli | H03L 7/08 |
| | | | 331/16 |
| 2017/0063387 A1* | 3/2017 | Gao | H03B 5/1228 |
| 2018/0212610 A1* | 7/2018 | Bae | H03L 7/02 |
| 2018/0287839 A1* | 10/2018 | Ibrahim | H04L 27/12 |
| 2019/0035848 A1* | 1/2019 | Tanaka | H03B 5/04 |

* cited by examiner

CALIBRATION OF A VOLTAGE CONTROLLED OSCILLATOR TO TRIM THE GAIN THEREOF, USING A PHASE LOCKED LOOP AND A FREQUENCY LOCKED LOOP

TECHNICAL FIELD

This disclosure is directed to the field of locked loop circuits, and, in particular, to techniques and circuits for calibrating a voltage controlled oscillator for use with a phase locked loop, using a calibration process involving a frequency locked loop.

BACKGROUND

Locked loop circuits, such as phase locked loop circuits, are basic components of radio, wireless, and telecommunication technologies. A phase locked loop or phase lock loop (PLL) is a control system that generates an output signal having a phase related to the phase of an input signal.

A sample PLL is now described with reference to FIG. 1. The PLL 50 includes a variable frequency oscillator 58 (here, a voltage controller oscillator VCO), a divider 60, a phase frequency detector (PFD) 52, a charge pump 54, and a loop filter 56. The VCO 58 generates a periodic signal Fout, and the divider 60 divides the frequency of the output signal Fout, to produce signal Fdiv. The phase frequency detector 52 compares the phase of that signal Fdiv with the phase of a reference periodic signal Fref, and generates the control signals UP, DN for the charge pump 54 based based that phase comparison. When the phase of the signal Fref leads the phase of the signal Fdiv, the control signal UP is asserted at a logic high, while the control signal DN remains at a logic low. Conversely, when the phase of the signal Fref lags the phase of the signal Fdiv, the control signal DN is asserted at a logic high, while the control signal UP remains at a logic low. When the phase of the signal Fref and the phase of the signal Fdiv match, neither UP nor DN are asserted logic high.

The charge pump 54 generates a control signal for the VCO 58, which is passed through the loop filter 56, which extracts the low frequency content of the control signal. The VCO 58, in response to the control signal, adjusts the phase and frequency of the output signal Fout. When UP is asserted, the charge pump 54 increases the voltage of the control signal, as opposed to decreasing the voltage of the control signal when DN is asserted. Those of skill in the art will appreciate that since the phase of the signal Fref cannot both lead and lag the phase of the signal Fdiv, the phase frequency detector 110 will not simultaneously assert both UP and DN.

In addition to synchronizing signals, the PLL 50 can track an input frequency, or it can generate a frequency that is a multiple (or fraction) of the input frequency.

Such phase locked loops are widely employed in radio, telecommunications, computers and other electronic applications. They can be used to provide inputs to circuits that demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase locked loop building block, phase locked loops are widely used in modern electronic devices, with output frequencies from a fraction of a hertz up to many gigahertz.

In some cases, it may be desirable for a phase locked loop to be operable over a wide band of frequencies. In order to produce such wide band phase locked loops, a charge pump circuit is typically employed in the loop to generate the control signals sent to the oscillator.

As stated, in some cases, a PLL may generate a frequency that is a fraction of the input frequency. However, the bandwidth of such a PLL may be low, and the lock time may be undesirable high. In addition, the reduction of jitter in such designs is difficult.

Therefore, further development work on PLL circuits is needed.

SUMMARY

Disclosed herein is a circuit including a controllable oscillator, and a bias signal generator circuit configured to generate an oscillator control signal for the controllable oscillator. The circuit also includes a first bias calibrator configured to control the bias signal generator circuit so as to calibrate a voltage of the oscillator control signal as produced by the bias signal generator circuit, and a second bias calibrator configured to control the bias signal generator circuit so as to calibrate a transconductance of the bias signal generator circuit. A phase locked loop utilizes the controllable oscillator, and a frequency locked loop utilizes the controllable oscillator. A first switch selectively couples the first bias calibrator to the bias signal generator circuit, and a second switch selectively couples the phase locked loop to the bias signal generator circuit. The first bias calibrator is configured to calibrate the voltage of the oscillator control signal in a first calibration step, and to enable the frequency locked loop upon completion of the first calibration step, thereby beginning a second calibration step. The second bias calibrator is configured to calibrate the transconductance of the bias signal generator circuit in the second calibration step, and to disable the frequency locked loop and enable the phase locked loop upon completion of the second calibration step. The second bias calibrator is further configured to close the first switch and open the second switch during the first and second calibration steps, and to open the first switch and close the second switch upon completion of the second calibration step.

The controllable oscillator may be a voltage controlled oscillator.

The bias signal generator circuit may include a primary transistor having a first conduction terminal coupled to a first node, a second conduction terminal coupled to a second node, and a control terminal biased by the first bias calibrator. The bias signal generator circuit may also include a plurality of selectable second transistors each having a first conduction terminal, a second conduction terminal, and a control terminal to be biased by first bias calibrator when the first switch is closed. This second bias calibrator may be configured to, in the second calibration step, selectively couple zero or more of the selectable second transistors between the first and second nodes. The oscillator control signal may be generated at the second node.

The first bias calibrator may include a transistor having a first conduction terminal coupled to a supply node, a second conduction terminal coupled to a third node, and a control terminal coupled to its second conduction terminal and to the first switch. A configurable current mirror may be coupled between a reference current and the third node, with the configurable current mirror containing a number of selectable transistors in a current mirror arrangement.

The first bias calibrator may include a comparator having inputs coupled to an output of the configurable current mirror and to a reference voltage, and a logic block receiving output of the comparator as input, and configured to, in the first calibration step, selectively couple an appropriate number of the selectable transistors into the current mirror arrangement.

The first bias calibrator may control the bias signal generator so as to calibrate the voltage of the oscillator control signal to match a desired voltage.

The second bias calibrator may control the transconductance of the bias signal generator circuit by adjusting a current of the oscillator control signal to match a desired current, thereby calibrating the transconductance of the bias signal generator circuit.

The second bias calibrator may control the transconductance of the bias signal generator circuit by adjusting the current of the oscillator control signal, thereby calibrating the transconductance of the bias signal generator circuit.

The frequency locked loop may be a digital frequency locked loop.

The phase locked loop may be an analog phase locked loop.

The phase locked loop may include a loop filter having an output coupled to the second switch, a charge pump having an output coupled to an input of the loop filter, and a phase frequency detector having an output coupled to an input of the charge pump and having inputs receiving a reference clock and a feedback clock. A loop divider may have an output generating the feedback clock. The controllable oscillator provides output to an input of the loop divider and receives input from the bias signal generator circuit.

The second bias calibrator may control the transconductance of the bias signal generator circuit as a function of VCO output frequency cycles counted in a window of a reference frequency.

Also disclosed herein is a method of calibrating a voltage controlled oscillator (VCO) for a phase locked loop. The method may include prior to activating the phase locked loop, and prior to activating a frequency locked loop, causing a bias signal generator circuit to generate a control signal with a fixed control voltage for the VCO. The method may also include activating the frequency locked loop, and adjusting the bias signal generator to calibrate a transconductance of the bias signal generator while the frequency locked loop is activated, and deactivating the frequency locked loop and activating the phase locked loop.

Calibrating the transconductance of the bias signal generator may include adjusting a current and/or voltage of the control signal.

Calibrating the transconductance of the bias signal generator may be performed as a function of VCO output frequency cycles counted in a window of a reference frequency.

Calibrating the transconductance of the bias signal generator may serve to center a gain of the VCO across process, voltage, and temperature.

Also disclosed herein is a circuit including a PLL with an oscillator generating an output oscillation signal having a frequency set by a control signal. A bias circuit includes a first current source having a control terminal biased by a bias voltage and a second current source having a control terminal biased by a control voltage generated in response to a phase comparison of the oscillation signal to a reference signal, the first and second current sources in combination configured to generate the control signal. A first calibration circuit is configured to calibrate the bias voltage. A second calibration circuit is configured to calibrate a transconductance of the second current source.

The second calibration circuit may calibrate the transconductance of the bias signal generator by adjusting a current produced by the second current source.

The second calibration circuit may calibrate the transconductance of the bias signal generator by adjusting a voltage produced by the second current source.

The second calibration circuit may calibrate the transconductance of the bias signal generator as a function of cycles of the output oscillation signal counted in a window of a reference frequency.

DETAILED DESCRIPTION

One or more embodiments will be described below. These described embodiments are only examples of implementation techniques, as defined solely by the attached claims. Additionally, in an effort to provide a focused description, irrelevant features of an actual implementation may not be described in the specification.

Figure 2:
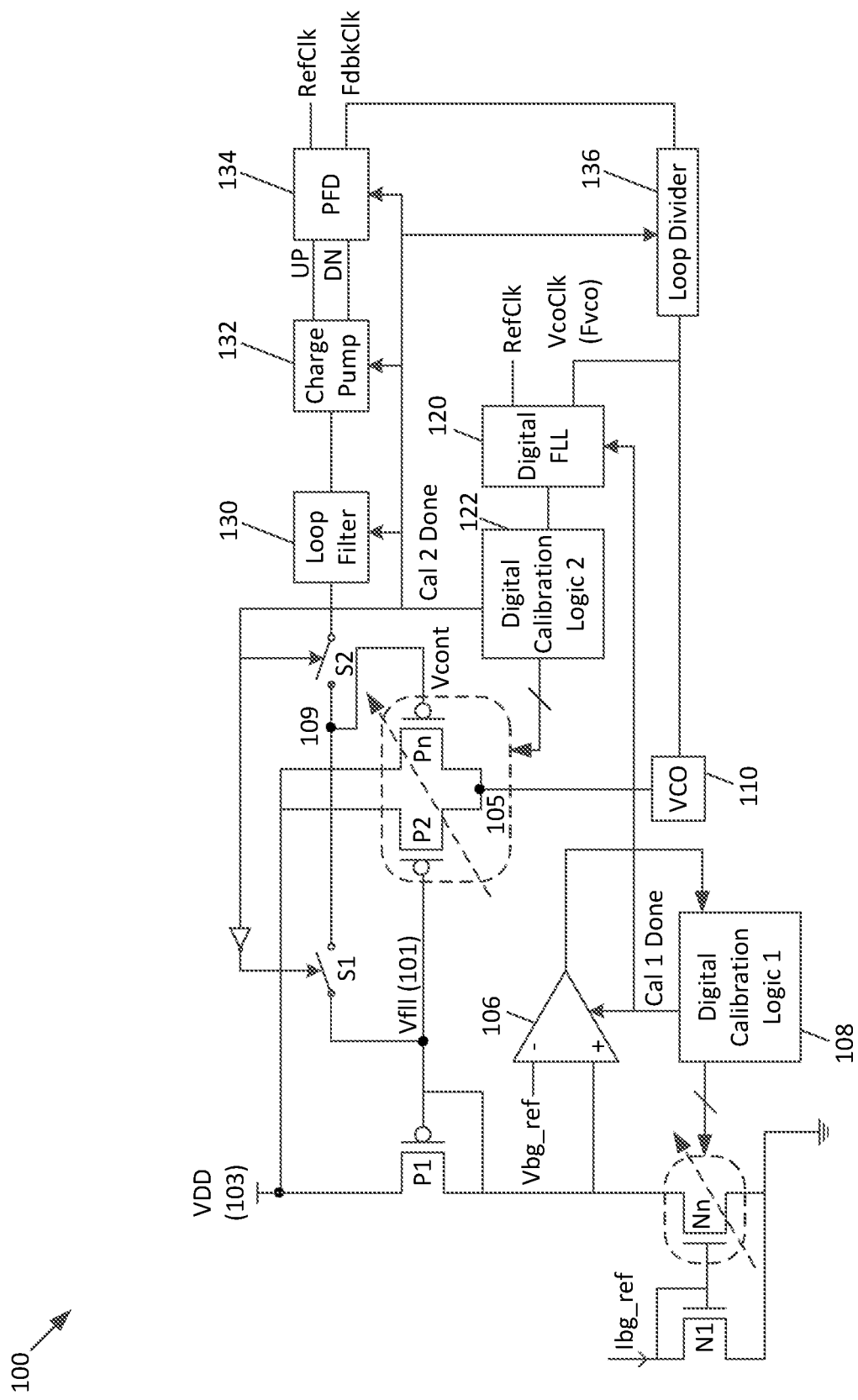
FIG. 2 is a schematic block diagram of a phase locked loop, together with associated configuration circuitry for its oscillator, in accordance with this disclosure.

With reference to FIG. 2, a circuit 100 is now described. This circuit 100 utilizes various components, including a digital frequency locked loop 120, to configure a VCO 110 to be used during phase locked loop operation. First, the structure of the circuit 100 will be described, and thereafter, operation of the circuit 100 will be described.

In detail, the circuit 100 includes NMOS transistor N1 in a current mirror relationship with any number n of NMOS transistors Nn. Transistor N1 receives a reference current Ibg_ref at its drain, and the NMOS transistors Nn mirror that current such that it is drawn from their drains to their sources, and to ground. PMOS transistor P1 has its source coupled to a supply voltage VDD at node 103, its drain coupled to the drains of transistors Nn at node 101, and its gate coupled to its drain. The current Ibg_ref is a reference current generated from a bandgap circuit.

PMOS transistor P2 has its source coupled to voltage VDD at node 103, its drain coupled to node 105, and its gate coupled to the gate of transistor P1 at node 107 (P1+P2 form a current mirror). Any number of PMOS transistors Pn have sources coupled to voltage VDD at node 103, drains coupled to node 105, and gates coupled to node 109. Switch S1 is coupled between node 107 and node 109 when S1 is closed. Pn are in a current mirror relationship with P1 and P2. Node 105 is coupled to VCO 110.

Comparator 106 has its inverting terminal coupled to a reference voltage Vbg_ref, its non-inverting terminal coupled to node 101, and its output coupled to an input of digital calibration logic 108. The digital calibration logic 108 serves, in operation, to couple a given number of transistors Nn into a current mirroring relationship with transistor N1, and to enable or disable comparator 106 and digital FLL 120 through asserting or deasserting the Cal1Done signal. The voltage Vbg_ref is a reference voltage generated by a bandgap circuit.

Switch S2 is coupled between node 109 and loop filter 130. Loop filter 130 is in turn coupled to the output of charge pump 132, which itself in turn is coupled to the output of phase frequency detector 134. Phase frequency detector receives as input a reference clock signal RefClk, as well as a feedback clock signal FdbkClk output from loop divider 136. Loop divider 136 has its output coupled to VCO 110 at node 111.

Digital FLL 120 has its output coupled to digital calibration logic 122, and receives as input the reference clock signal RefClk and a signal Vcoclk (having frequency Fvco) output by the VCO 110. Digital calibration logic 122 serves, in operation, to couple a given number of transistors Pn between nodes 103 and 105, to actuate switches S1 and S2, and to enable or disable loop filter 130, charge pump 132, PFD 134, and loop divider 136.

Operation of the circuit 100 is now described. The circuit 100 operates in three modes: a first calibration mode, a second calibration mode, and a normal mode of operation. Upon power-up, the first calibration mode is entered. In the first calibration mode, the digital calibration logic 122 turns switch S2 off and turns switch S1 on. In addition, the digital calibration logic 108 enables the comparator 106, and disables the digital FLL 120. Comparator 106 compares the voltage at node 101 to the reference voltage Vbg_ref, and provides the result of that comparison to digital calibration logic 108. If the voltage at node 101 is less than Vbg_ref, then digital calibration logic 108 decreases the number of transistors Nn switched on, and if the voltage at node 101 is greater than Vbg_ref, then digital calibration logic increases the number of transistors Nn switched on, with the ultimate goal of the voltage at node 101 being equal to Vbg_ref, despite process and temperature variations. The voltage at 101 therefore sets the gate voltage of transistor P1 and P2, as well as transistors Pn.

When the voltage at node 101 is equal to Vbg_ref, then the first calibration mode is completed. The digital calibration logic 108, upon completion of the first calibration node, enables the digital frequency locked loop 120, thereby marking entry into the second calibration mode. In the second calibration mode, the digital calibration logic 122 keeps switch S2 off and switch S1 on. The loop filter 130, charge pump 132, PFD 134, and loop divider 136 remain off. A control signal CTRL for the VCO 110 is produced at node 105, and this control signal CTRL is based upon the number of transistors Nn switched on, and thus, the voltage at 106 and the ratio of P1 to P2 and the number of Pn turned on.

The digital frequency locked loop 120 receives the reference clock RefClk, compares it to the VCO 110 clock Vco, and then adjusts (increases or decreases) the number of transistors Pn switched on, thereby increasing or decreasing the number of transistors Pn coupled between node 109 and node 105, and in turn, the current of the control signal CTRL for the VCO 110. Since the voltage of the control signal CTRL is set by the voltage at 101, which is not adjusted during the second calibration mode, and since the current of the control signal CTRL is set during the second calibration, the second calibration mode, through the number of transistors Pn coupled between node 109 and node 105, adjusts the transconductance of the circuit formed by transistors P2-Pn. In particular, the transconductance adjusted until the gain of the VCO 110 is centered.

Figure 1:
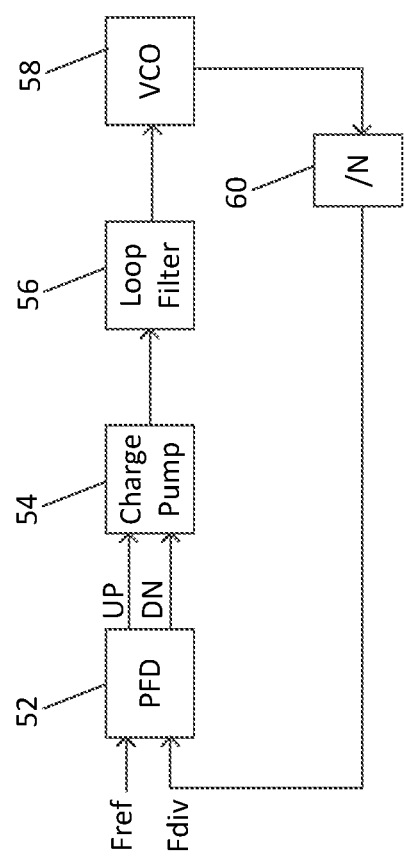
FIG. 1 is a schematic block diagram of a generic phase locked loop utilizing a charge pump.

Once the gain of the VCO 110 is centered, the second calibration mode is completed, and the digital calibration logic 122 asserts the Cal2Done signal, which serves to switch S1 off and S2 on, and to then activate the loop filter 130, charge pump 132, PFD 134, and loop divider 136 to thereby begin phased locked loop operation mode. In PLL operation, the control signal output of the loop filter 136 biases the gates of the selected transistors to adjust the CTRL signal controlling the VCO 110. Operation here is otherwise discussed with respect to FIG. 1.

The above design has a variety of advantages. Since, there is no additional circuit in PLL mode, there is no additional source of phase noise. In addition, since the gain of the VCO 110 has been calibrated, the noise from the VCO 110 is shaped, reducing phase noise. In addition, jitter is constrained, and the open loop phase noise of the VCO 110 has been improved. The stability of PLL mode operation is reduced, while variation in the bandwidth is reduced. Lock time in PLL mode is greatly decreased due to the initial use of the frequency locked loop 120.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
   a controllable oscillator;
   a bias signal generator circuit configured to generate an oscillator control signal for the controllable oscillator;
   a first bias calibrator configured to control the bias signal generator circuit so as to calibrate a voltage of the oscillator control signal as produced by the bias signal generator circuit;
   a second bias calibrator configured to control the bias signal generator circuit so as to calibrate a transconductance of the bias signal generator circuit;
   a phase locked loop that utilizes the controllable oscillator;
   a frequency locked loop that utilizes the controllable oscillator;
   a first switch selectively coupling an output of the first bias calibrator to an input of the bias signal generator circuit;
   a second switch selectively coupling the phase locked loop to the bias signal generator circuit;
   wherein the first bias calibrator is configured to calibrate the voltage of the oscillator control signal in a first calibration step, and to enable the frequency locked loop upon completion of the first calibration step, thereby beginning a second calibration step;
   wherein the second bias calibrator is configured to calibrate the transconductance of the bias signal generator circuit in the second calibration step, and to disable the frequency locked loop and enable the phase locked loop upon completion of the second calibration step;
   wherein the second bias calibrator is further configured to close the first switch and open the second switch during the first and second calibration steps, and to open the first switch and close the second switch upon completion of the second calibration step.

2. The circuit of claim 1, wherein the controllable oscillator comprises a voltage controlled oscillator.

3. The circuit of claim 1, wherein the bias signal generator circuit comprises:
   a primary transistor having a first conduction terminal coupled to a first node, a second conduction terminal coupled to a second node, and a control terminal biased by the first bias calibrator;
   a plurality of selectable second transistors each having a first conduction terminal, a second conduction terminal, and a control terminal to be biased by the first bias calibrator when the first switch is closed;

wherein the second bias calibrator is configured to, in the second calibration step, selectively couple zero or more of the selectable second transistors between the first and second nodes;

wherein the oscillator control signal is generated at the second node.

4. The circuit of claim 1, wherein the first bias calibrator comprises:
a transistor having a first conduction terminal coupled to a supply node, a second conduction terminal coupled to a third node, and a control terminal coupled to the second conduction terminal and to the first switch; and
a configurable current mirror coupled between a reference current and the third node, wherein the configurable current mirror contains a number of selectable transistors in a current mirror arrangement.

5. The circuit of claim 4, wherein the first bias calibrator further comprises:
a comparator having inputs coupled to an output of the configurable current mirror and to a reference voltage;
a logic block receiving output of the comparator as input, and configured to, in the first calibration step, selectively couple an appropriate number of the selectable transistors into the current mirror arrangement.

6. The circuit of claim 1, wherein the first bias calibrator controls the bias signal generator circuit so as to calibrate the voltage of the oscillator control signal to match a desired voltage.

7. The circuit of claim 1, wherein the second bias calibrator controls the transconductance of the bias signal generator circuit by adjusting a current of the oscillator control signal to match a desired current, thereby calibrating the transconductance of the bias signal generator circuit.

8. The circuit of claim 1, wherein the second bias calibrator controls the transconductance of the bias signal generator circuit by adjusting the voltage of the oscillator control signal, thereby calibrating the transconductance of the bias signal generator circuit.

9. The circuit of claim 1, wherein the frequency locked loop comprises a digital frequency locked loop.

10. The circuit of claim 1, wherein the phase locked loop comprises an analog phase locked loop.

11. The circuit of claim 1, wherein the phase locked loop comprises:
a loop filter having an output coupled to the second switch;
a charge pump having an output coupled to an input of the loop filter;
a phase frequency detector having an output coupled to an input of the charge pump and having inputs receiving a reference clock and a feedback clock;
a loop divider having an output generating the feedback clock;
wherein the controllable oscillator provides output to an input of the loop divider and receives input from the bias signal generator circuit.

12. The circuit of claim 1, wherein the second bias calibrator controls the transconductance of the bias signal generator circuit as a function of a number of VCO output frequency cycles counted in a window of a reference frequency.

13. A method of calibrating a voltage controlled oscillator (VCO) for a phase locked loop, the method comprising:
prior to activating the phase locked loop, and prior to activating a frequency locked loop, using a first bias calibrator to cause a bias signal generator circuit to generate a control signal with a fixed control voltage for the VCO;
activating the frequency locked loop, and closing a switch to couple an output of the first bias calibrator to an input of the bias signal generator circuit to thereby adjust the bias signal generator circuit to calibrate a transconductance of the bias signal generator circuit while the frequency locked loop is activated;
deactivating the frequency locked loop and activating the phase locked loop.

14. The method of claim 13, wherein calibrating the transconductance of the bias signal generator circuit comprises adjusting a current of the control signal.

15. The method of claim 13, wherein calibrating the transconductance of the bias signal generator circuit comprises adjusting the voltage of the control signal.

16. The method of claim 13, wherein calibrating the transconductance of the bias signal generator circuit is performed as a function of a number of VCO output frequency cycles counted in a window of a reference frequency.

17. The method of claim 13, wherein calibrating the transconductance of the bias signal generator circuit serves to center a gain of the VCO across process, voltage, and temperature.

18. A circuit, comprising:
a phase locked loop (PLL) including an oscillator generating an output oscillation signal having a frequency set by a control signal;
a bias circuit including a first current source having a control terminal biased by a bias voltage and a second current source having a control terminal biased by a control voltage generated in response to a phase comparison of the output oscillation signal to a reference signal, the first and second current sources in combination configured to generate the control signal;
a first calibration circuit configured to calibrate the bias voltage; and
a second calibration circuit configured to calibrate a transconductance of the first and second current source.

19. The circuit of claim 18, wherein the second calibration circuit calibrates the transconductance of the bias circuit by adjusting a current produced by the first and second current source.

20. The circuit of claim 18, wherein the second calibration circuit calibrates the transconductance of the bias circuit by adjusting a voltage produced by the first and second current source.

21. The circuit of claim 18, wherein the second calibration circuit calibrates the transconductance of the bias circuit as a function of a number cycles of the output oscillation signal counted in a window of a reference frequency.

* * * * *